United States Patent
Chung et al.

(10) Patent No.: US 12,329,023 B2
(45) Date of Patent: Jun. 10, 2025

(54) POLYMER AND STRETCHABLE POLYMER THIN FILM AND ELECTRONIC DEVICE

(71) Applicant: Samsung Electronics Co., Ltd., Suwon-si (KR)

(72) Inventors: Jong Won Chung, Hwaseong-si (KR); Sangah Gam, Seoul (KR); Yeongjun Lee, Seongnam-si (KR); Youngjun Yun, Seongnam-si (KR); Gae Hwang Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 756 days.

(21) Appl. No.: 17/519,998

(22) Filed: Nov. 5, 2021

(65) Prior Publication Data
US 2022/0285624 A1 Sep. 8, 2022

(30) Foreign Application Priority Data
Mar. 4, 2021 (KR) .......................... 10-2021-0028984

(51) Int. Cl.
*H10K 85/10* (2023.01)
(52) U.S. Cl.
CPC .................................. *H10K 85/111* (2023.02)
(58) Field of Classification Search
CPC ................ H10K 85/111; C08G 61/126; C08G 2261/3243; C08G 2261/3223; C08G 2261/124; C08G 2261/414; C08G 2261/91; C08G 2261/95; H01L 51/0097; H01L 51/0043; H01L 51/0072; H01L 51/0074; H01L 2251/5338
See application file for complete search history.

(56) References Cited

U.S. PATENT DOCUMENTS

| | | | |
|---|---|---|---|
| 8,912,305 B2 | 12/2014 | Duggeli et al. | |
| 2011/0240981 A1* | 10/2011 | Duggeli ............... | H10K 85/113 528/367 |
| 2013/0140494 A1* | 6/2013 | Wu ...................... | H10K 85/111 252/500 |
| 2017/0346013 A1* | 11/2017 | Chung ................ | C08G 61/125 |
| 2019/0040188 A1* | 2/2019 | Nanson ............... | C07D 519/00 |
| 2020/0243770 A1* | 7/2020 | Park .................... | C08G 61/126 |
| 2023/0006141 A1* | 1/2023 | Park .................... | H10K 85/50 |

FOREIGN PATENT DOCUMENTS

| | | |
|---|---|---|
| WO | WO-2017/133752 A1 | 8/2017 |
| WO | WO-2018/169256 A2 | 9/2018 |

OTHER PUBLICATIONS

Takao Sakamoto et al., 'Condensed Heteroaromatic Ring Systems. IV. Synthesis of Naphthyridine Derivatives by Cyclization of Aminopyridineacrylic Esters' *Chem. Pharm. Bull.*, vol. 33, No. 11, Mar. 1985, pp. 4764-4768.

* cited by examiner

*Primary Examiner* — Shane Fang
(74) *Attorney, Agent, or Firm* — HARNESS, DICKEY & PIERCE, P.L.C.

(57) ABSTRACT

A polymer may include a first structural unit including a first electron accepting moiety and a first electron donating moiety, a second structural unit including a second electron accepting moiety and a second electron donating moiety. The second electron accepting moiety is different from the first electron accepting moiety. The second electron donating moiety is the same as or different from the first electron donating moiety. The first structural unit is represented by Chemical Formula 1. Chemical Formula 1 is described in the detailed description.

19 Claims, 11 Drawing Sheets

POLYMER AND STRETCHABLE POLYMER THIN FILM AND ELECTRONIC DEVICE

CROSS-REFERENCE TO RELATED APPLICATION

This application claims priority to and the benefit of Korean Patent Application No. 10-2021-0028984, filed in the Korean Intellectual Property Office on Mar. 4, 2021, the entire contents of which are incorporated herein by reference.

BACKGROUND

1. Field

A polymer, a stretchable polymer thin film and an electronic device are disclosed.

2. Description of the Related Art

In recent years, research on a stretchable display device or a bio-wearable device such as a smart skin device, a soft robot, and a biomedical device has been conducted. In addition to electrical characteristics, these devices should have stretchability in an arbitrary direction according to external movements or motions, and at the same time should be able to maintain their original performance after being restored, and thus a new material suitable for this is required.

SUMMARY

Some example embodiments provide a polymer satisfying stretchability and electrical characteristics.

Some example embodiments provide a stretchable polymer thin film including the polymer.

Some example embodiments provide an electronic device including the polymer or the stretchable polymer thin film.

According to some example embodiments, a polymer includes a first structural unit including a first electron accepting moiety and a first electron donating moiety; and a second structural unit including a second electron accepting moiety and a second electron donating moiety. The second electron accepting moiety is different from the first electron accepting moiety. The second electron donating moiety is the same as or different from the first electron donating moiety. The first structural unit is represented by Chemical Formula 1.

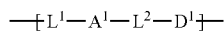
[Chemical Formula 1]

In Chemical Formula 1, $D^1$ is the first electron donating moiety, $L^1$ and $L^2$ are each independently a single bond, a substituted or unsubstituted C6 to C30 arylene group, a substituted or unsubstituted divalent C3 to C30 heterocyclic group, a fused ring thereof, or a combination thereof, and $A^1$ is the first electron accepting moiety and is represented by Chemical Formula 2,

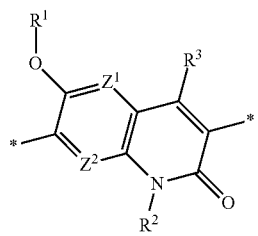
[Chemical Formula 2]

wherein, in Chemical Formula 2, $Z^1$ and $Z^2$ are each independently N or $CR^a$, at least one of $Z^1$ and $Z^2$ is N, $R^1$ is a substituted or unsubstituted C1 to C30 alkyl group, a substituted or unsubstituted C2 to C30 alkoxyalkyl group, a substituted or unsubstituted C6 to C30 aryl group, $—COR^b$, $—COOR^c$, a halogen, a cyano group, or a combination thereof, $R^2$, $R^3$, and $R^a$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, $—COR^d$, $—OCOR^e$, $—COOR^f$, $—OCOOR^g$, a halogen, a cyano group, or a combination thereof, $R^b$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and

*is a linking point with Chemical Formula 1.

In some embodiments, $D^1$ may be a substituted or unsubstituted C6 to C30 arylene group; a substituted or unsubstituted divalent C3 to C30 heterocyclic group including at least one of N, O, S, Se, Te, and Si; a fused ring thereof; or a combination thereof.

In some embodiments, $D^1$ may be one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered rings including at least one of N, O, S, Se, Te, and Si; a fused ring of two or more of the substituted or unsubstituted five-membered rings; a fused ring of at least one of the substituted or unsubstituted five-membered rings and at least one substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group a fused ring of one or more substituted or unsubstituted five-membered ring and one or more substituted or unsubstituted phenanthrenylene group; or a combination thereof.

In some embodiments, $L^1$ and $L^2$ may each independently be a substituted or unsubstituted C6 to C30 arylene group; a substituted or unsubstituted divalent C3 to C30 heterocyclic group including at least one of N, O, S, Se, Te, and Si; a fused ring thereof; or a combination thereof, and each of $L^1$ and $L^2$ may be different from $D^1$.

In some embodiments, the first structural unit may be represented by Chemical Formula 3.

[Chemical Formula 3]

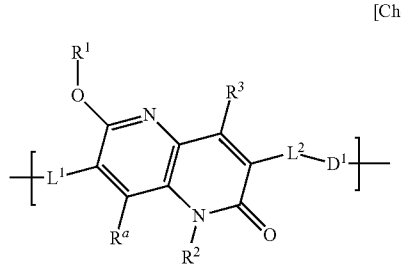

[Chemical Formula 5]

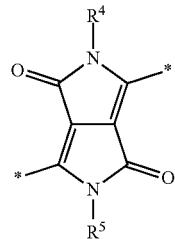

In Chemical Formula 3, $D^1$ may be a substituted or unsubstituted C6 to C30 arylene group; a substituted or unsubstituted divalent C3 to C30 heterocyclic group including at least one of N, O, S, Se, Te, and Si; a fused ring thereof; or a combination thereof, $L^1$ and $L^2$ may each independently be a single bond, a substituted or unsubstituted C6 to C30 arylene group, a substituted or unsubstituted divalent C3 to C30 heterocyclic group, a fused ring thereof, or a combination thereof, $R^1$ may be a substituted or unsubstituted C1 to C30 alkyl group, a substituted or unsubstituted C2 to C30 alkoxyalkyl group, a substituted or unsubstituted C6 to C30 aryl group, —$COR^b$, —$COOR^c$, a halogen, a cyano group, or a combination thereof, $R^2$, $R^3$, and $R^a$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or a combination thereof, and $R^b$ to $R^g$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof.

In some embodiments, $R^1$ and $R^2$ may each independently be a substituted or unsubstituted C6 to C30 linear alkyl group or a substituted or unsubstituted C6 to C30 branched alkyl group.

In some embodiments, the second structural unit may be represented by Chemical Formula 4.

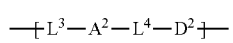
[Chemical Formula 4]

In Chemical Formula 4, $D^2$ may be the second electron donating moiety, $L^3$ and $L^4$ may each independently be a single bond, a substituted or unsubstituted C6 to C30 arylene group, a substituted or unsubstituted divalent C3 to C30 heterocyclic group, a fused ring thereof, or a combination thereof, and $A^2$ may be the second electron accepting moiety and may be represented by Chemical Formula 5, wherein, in Chemical Formula 5, $R^4$ and $R^5$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or a combination thereof, $R^d$ to $R^g$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and

*may be a linking point with Chemical Formula 4.

In some embodiments, $D^2$ may be a substituted or unsubstituted C6 to C30 arylene group; a substituted or unsubstituted divalent C3 to C30 heterocyclic group including at least one of N, O, S, Se, Te, and Si; a fused ring thereof; or a combination thereof.

In some embodiments, $D^2$ may be one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered rings including at least one of N, O, S, Se, Te, and Si; a fused ring of two or more of the substituted or unsubstituted five-membered rings; a fused ring of at least one of the substituted or unsubstituted five-membered rings and at least one substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group a fused ring of one or more substituted or unsubstituted five-membered ring and one or more substituted or unsubstituted phenanthrenylene group; or a combination thereof.

In some embodiments, $L^3$ and $L^4$ may each independently be a substituted or unsubstituted C6 to C30 arylene group; a substituted or unsubstituted divalent C3 to C30 heterocyclic group including at least one of N, O, S, Se, and Te; a fused ring thereof; or a combination thereof, and each of $L^3$ and $L^4$ may be different from $D^2$.

In some embodiments, the first structural unit may be represented by Chemical Formula 3 and the second structural unit may be represented by Chemical Formula 6.

[Chemical Formula 3]

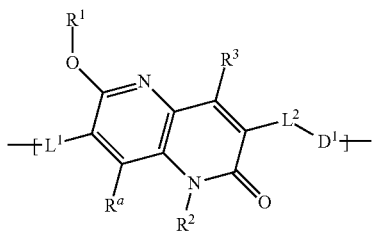

[Chemical Formula 6]

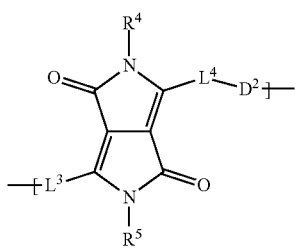

In Chemical Formula 3 or 6, $L^1$ to $L^4$ may each independently be a substituted or unsubstituted C6 to C30 arylene group; a substituted or unsubstituted divalent C3 to C30 heterocyclic group including at least one of N, O, S, Se, and Te; a fused ring thereof; or a combination thereof, $R^1$ may be a substituted or unsubstituted C1 to C30 alkyl group, a substituted or unsubstituted C2 to C30 alkoxyalkyl group, a substituted or unsubstituted C6 to C30 aryl group, —$COR^b$, —$COOR^c$, a halogen, a cyano group, or a combination thereof, $R^2$ to $R^5$ and $R^a$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or a combination thereof, $R^b$ to $R^g$ may each independently be hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and $D^1$ and $D^2$ may each independently be one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered rings including at least one of N, O, S, Se, Te, and Si; a fused ring of two or more of the substituted or unsubstituted five-membered rings; a fused ring of at least one of the substituted or unsubstituted five-membered rings and at least one substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group a fused ring of one or more substituted or unsubstituted five-membered ring and one or more substituted or unsubstituted phenanthrenylene group; or a combination thereof.

In some embodiments, the second electron donating moiety may be the same as the first electron donating moiety.

In some embodiments, a difference between a twist angle between $A^1$ and $L^1$ and a twist angle between $A^1$ and $L^2$ of the first structural unit may be about twice or more.

In some embodiments, the first structural unit may be a structural unit providing stretchability.

In some embodiments, the first structural unit and the second structural unit may be included in a mole ratio of about 1:9 to about 9:1.

According to some example embodiments, a stretchable polymer thin film including the polymer is provided.

In some embodiments, the stretchable polymer thin film may further include an elastomer.

In some embodiments, the stretchable polymer thin film may have a change in charge mobility of less than or equal to about 10% when stretched by about 30%.

According to some example embodiments, an electronic device including the stretchable polymer thin film is provided.

In some embodiments, the electronic device may include an organic diode, an organic thin film transistor, or a wearable device.

The polymer may satisfy stretchability and electrical characteristics simultaneously, and thus may be effectively applied to stretchable electronic devices.

DETAILED DESCRIPTION

Figure 1:
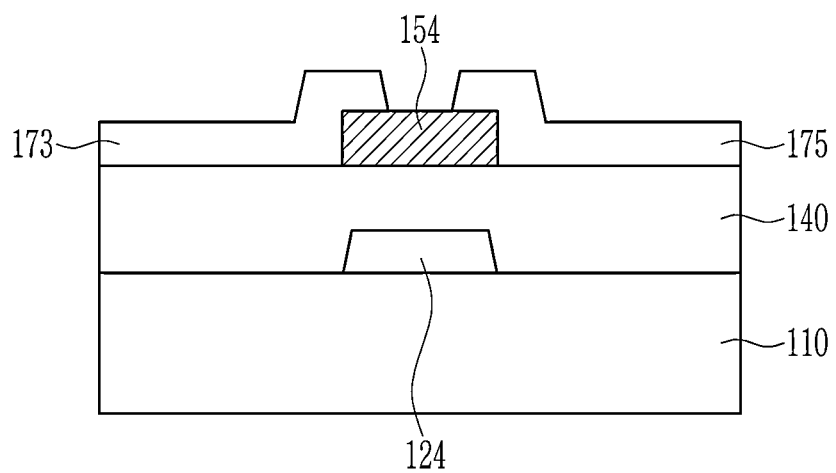
FIGS. 1 to 3 are cross-sectional views each showing a thin film transistor according to some example embodiments.

Hereinafter, some example embodiments are described in detail so that those skilled in the art can easily implement them. However, the actual applied structure may be implemented in various different forms and is not limited to the implementations described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" refers to the replacement of a hydrogen atom of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms of N, O, S, Se, Te, Si, and P.

As used herein, when a definition is not otherwise provided, "alkyl group" may be a linear or branched saturated monovalent hydrocarbon group (e.g., a methyl group, an ethyl group, a propyl group, an isobutyl group, a sec-butyl group, a tert-butyl group, a pentyl group, an iso-amyl group, a hexyl group, and the like).

As used herein, when a definition is not otherwise provided, "alkoxy group" may refer to an alkyl group that is linked via an oxygen, e.g., a methoxy group, an ethoxy group, and a sec-butyloxy group.

As used herein, when a definition is not otherwise provided, "aryl group" refers to a monovalent functional group formed by the removal of one hydrogen atom from one or more rings of an arene, e.g., phenyl or naphthyl. The arene refers to a hydrocarbon having an aromatic ring, and includes monocyclic and polycyclic hydrocarbons wherein the additional ring(s) of the polycyclic hydrocarbon may be aromatic or nonaromatic.

As used herein, when a definition is not otherwise provided, "heterocyclic group" includes at least one heteroatom such as N, O, S, Se, Te, Si, and P in a ring such as an aryl group, a cycloalkyl group, a fused ring thereof, or a combination thereof, and the remaining carbon. When the heterocyclic group is a fused ring, a heteroatom may be included in the entire heterocyclic group or at least one of the rings.

As used herein, when a definition is not otherwise provided, "aromatic ring" refers to a functional group in which all atoms in the cyclic functional group have a p-orbital, and wherein these p-orbitals are conjugated. For example, the aromatic ring may be a C6 to C30 aryl group.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a polymer according to some example embodiments is described.

The polymer according to some example embodiments may be a stretchable polymer, and may be a copolymer including a first structural unit and a second structural unit having different structures. The first structural unit and the second structural unit may be semiconducting structural units that each have an electron donating moiety and an electron accepting moiety, and each of the structural units may exhibit semiconductor characteristics through an interaction between the electron donating moiety and the electron accepting moiety.

The electron donating moiety of the first structural unit and the electron donating moiety of the second structural unit may be the same or different, and the electron accepting moiety of the first structural unit and the electron accepting moiety of the second structural unit may be the same or different.

The first structural unit may be a structural unit capable of providing stretchability to the polymer, and at least one of the electron donating moiety and the electron accepting moiety in the first structural unit may have a structure capable of increasing a degree of freedom in the polymer main chain. The second structural unit may be a structural unit capable of providing improved electrical characteristics to the polymer, and may provide high charge mobility due to relatively high crystallinity.

As an example, the first structural unit may include a first electron accepting moiety and a first electron donating moiety, and optionally include a linking group linking the first electron accepting moiety and the first electron donating moiety.

For example, the first structural unit may be represented by Chemical Formula 1.

[Chemical Formula 1]

In Chemical Formula 1, $D^1$ is a first electron donating moiety, and $L^1$ and $L^2$ are each independently a single bond, a substituted or unsubstituted C6 to C30 arylene group, a substituted or unsubstituted divalent C3 to C30 heterocyclic group, a fused ring thereof, or a combination thereof, as a linking group, $A^1$ is a first electron accepting moiety and represented by Chemical Formula 2,

[Chemical Formula 2]

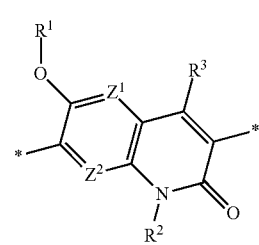

wherein, in Chemical Formula 2, $Z^1$ and $Z^2$ are each independently N or $CR^a$, at least one of $Z^1$ and $Z^2$ is N, $R^1$ is a substituted or unsubstituted C1 to C30 alkyl group, a substituted or unsubstituted C2 to C30 alkoxyalkyl group, a substituted or unsubstituted C6 to C30 aryl group, —$COR^b$, —$COOR^c$, a halogen, a cyano group, or a combination thereof, $R^2$, $R^3$, and $R^a$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or a combination thereof, $R^b$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof,

* is a linking point with Chemical Formula 1.

The first electron accepting moiety represented by Chemical Formula 2 introduces an asymmetric functional group at the ortho position with respect to the linking point (*) of the polymer main chain in the nitrogen-containing planar core, thereby asymmetrically inducing twisting of conjugate groups, and increasing a degree of freedom of the polymer main chain.

Specifically, in the first electron accepting moiety represented by Chemical Formula 2, a carbonyl group is bonded at the ortho position with respect to one of the linking points (*) of the polymer main chain, and a monovalent oxygen-containing group is bonded at the ortho position with respect to the other of the linking points (*) of the polymer main chain. Accordingly, in the first structural unit represented by Chemical Formula 1, each degree of interaction between the first electron accepting moiety ($A^1$) represented by Chemical Formula 2 and the linking groups ($L^1$ and $L^2$) on both sides is different, resulting in asymmetrical twisting. This asymmetrical twisting may increase the degree of freedom of the polymer main chain compared with the symmetrical twisting, and thus the stretchability of the polymer may be improved.

For example, the interaction between the monovalent oxygen-containing group (—O—$R^1$) of the first electron accepting moiety ($A^1$) represented by Chemical Formula 2 and one of the linking groups ($L^1$ and $L^2$) may be smaller than the interaction between the carbonyl group (C=O) of the first electron accepting moiety ($A^1$) represented by Chemical Formula 2 and the other of the linking groups ($L^1$ and $L^2$), and thus the twist angle may be large. Herein, the twist angle is an angle between the planar moieties. When the planar moieties are parallel, the twist angle may be about 0 degrees, and when the planar moieties are perpendicular to each other, the twist angle may be about 90 degrees.

For example, in the first structural unit, a difference between the twist angle between the first electron accepting moiety ($A^1$) and one of the linking groups ($L^1$ and $L^2$) and the twist angle between the first electron accepting moiety ($A^1$) and the other of the linking groups ($L^1$ and $L^2$) may be, for example, about 2.0 times or more, about 2.2 times or more, about 2.5 times or more, about 3.0 times or more, for example about 2.0 times to about 10 times, about 2.2 times to about 10 times, about 2.5 times to about 10 times, or about 3.0 times to about 10 times. For example, the twist angle between the carbonyl group (C=O) of the first electron accepting moiety ($A^1$) represented by Chemical Formula 2 and one of the linking groups ($L^1$ and $L^2$) may be less than about 10 degrees, about 1 degree to about 8 degrees, or about 2 degrees to about 6 degrees, and the twist angle between the monovalent oxygen-containing group (—O—$R^1$) of the first electron accepting moiety ($A^1$) represented by Chemical Formula 2 and one of the linking groups ($L^1$ and $L^2$) may be about 5 degrees to about 30 degrees, about 7 degrees to about 25 degrees, or about 8 degrees to about 20 degrees.

As described above, since the twist angle between the first electron accepting moiety ($A^1$) and the linking groups ($L^1$ and $L^2$) is different, the polymer main chain may have a degree of freedom, and accordingly, the polymer may respond flexibly to external force or external movement such as twisting, pressing and pulling and may be easily restored to its original state.

For example, in Chemical Formula 2, $Z^1$ may be N, and $Z^2$ may be $CR^a$.

For example, in Chemical Formula 2, $Z^1$ and $Z^2$ may be N.

For example, in Chemical Formula 2, each of $R^1$ and $R^2$ may be a relatively long chain alkyl group or a bulky branched alkyl group, for example independently a substituted or unsubstituted C6 to C30 linear alkyl group or a substituted or unsubstituted C6 to C30 branched alkyl group, and may be for example each independently a substituted or unsubstituted C10 to C30 linear alkyl group or a substituted or unsubstituted C10 to C30 branched alkyl group, for example a substituted or unsubstituted C15 to C30 linear alkyl group or a substituted or unsubstituted C15 to C30 branched alkyl group. Accordingly, the polymer may have high solubility in organic solvents.

The first electron donating moiety ($D^1$) is a moiety having electron donating characteristics, such as a substituted or unsubstituted C6 to C30 arylene group; a substituted or unsubstituted divalent C3 to C30 heterocyclic group including at least one of N, O, S, Se, Te, and Si; a fused ring thereof; or a combination thereof. For example, the first electron donating moiety ($D^1$) may be one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered ring including at least one of N, O, S, Se, Te, and Si; a fused ring of two or more of the substituted or unsubstituted five-membered rings; a fused ring of one or more substituted or unsubstituted five-membered rings and one or more substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group; a fused ring of one or more substituted or unsubstituted five-membered ring and one or more substituted or unsubstituted phenanthrenylene group; or a combination thereof.

The first electron donating moiety ($D^1$) may be, for example, one of the moieties listed in Group 1, but is not limited thereto.

[Group 1]

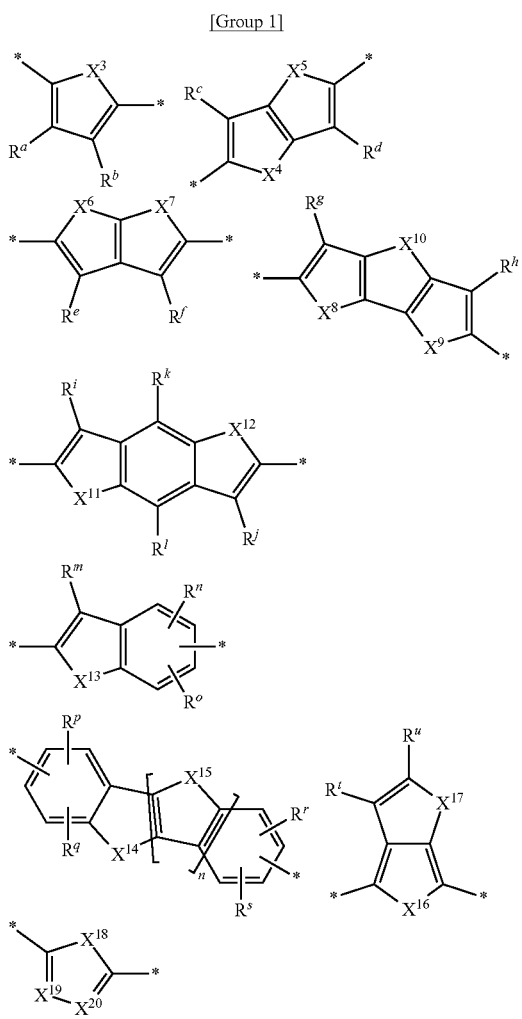

In Group 1,
X³ to X⁹ and X¹¹ to X¹⁸ are each independently O, S, Se, or Te,
X¹⁰ is O, S, Se, Te, NR$^v$, CR$^w$R$^x$, or SiR$^y$R$^z$,
X¹⁹ and X²⁰ are NR$^v$, CR$^w$R$^x$, or SiR$^y$R$^z$,
R$^a$ to R$^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof,
n is 0, 1, or 2, and
* is a linking point.

For example, L and L² may each independently be a single bond; the moieties listed in Group 1; a substituted or unsubstituted pyridine; a substituted or unsubstituted pyrimidine; a fused ring thereof; or a combination thereof.

For example, L¹ and L² may each independently be a divalent linking group including a single bond; at least one substituted or unsubstituted furan; at least one substituted or unsubstituted thiophene; at least one substituted or unsubstituted selenophene; at least one substituted or unsubstituted tellurophen; at least one substituted or unsubstituted pyrrole; at least one substituted or unsubstituted benzene; at least one substituted or unsubstituted pyridine; at least one substituted or unsubstituted pyrimidine; or a fused ring of the foregoing two or more; or a combination thereof. For example, L¹ and L² may be different from the first electron donating moiety (D¹), respectively.

For example, L¹ and L² may be the same.

For example, L¹ and L² may be different.

For example, the first structural unit may be represented by Chemical Formula 3.

[Chemical Formula 3]

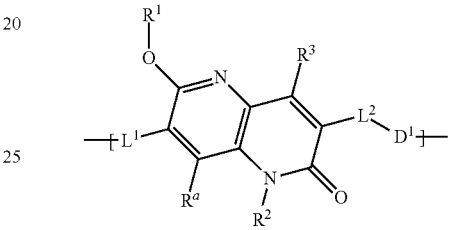

In Chemical Formula 3, L¹, L², D¹, R¹ to R³, and R$^a$ are as described above.

The second structural unit may include a second electron accepting moiety and a second electron donating moiety. The second electron accepting moiety may be different from the first electron accepting moiety, and the second electron donating moiety may be the same as or different from the first electron donating moiety.

For example, the second structural unit may be represented by Chemical Formula 4.

[Chemical Formula 4]

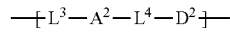

In Chemical Formula 4,
A² may be a second electron accepting moiety,
D² may be a second electron donating moiety,
L³ and L⁴ may be a linking group and may each independently be a single bond, a substituted or unsubstituted C6 to C30 arylene group, a substituted or unsubstituted divalent C3 to C30 heterocyclic group, a fused ring thereof, or a combination thereof.

The second electron accepting moiety (A²) may be, for example, represented by Chemical Formula 5.

[Chemical Formula 5]

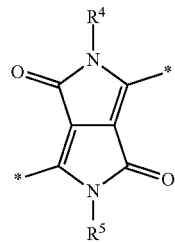

In Chemical Formula 5,

R[4] and R[5] are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —COR$^d$, —OCOR$^e$, —COOR$^f$, —OCOOR$^g$, a halogen, a cyano group, or a combination thereof, R$^d$ to R$^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and

* is a linking point with Chemical Formula 4.

The second electron donating moiety (D$^2$) may be the same as or different from the first electron donating moiety (D$^1$), and may be for example, a substituted or unsubstituted C6 to C30 arylene group; a substituted or unsubstituted divalent C3 to C30 heterocyclic group including at least one of N, O, S, Se, Te and Si; a fused ring thereof; or a combination thereof. For example, the second electron donating moiety (D$^2$) may be one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered ring including at least one of N, O, S, Se, Te, and Si; a fused ring of two or more of the substituted or unsubstituted five-membered rings; a fused ring of one or more substituted or unsubstituted five-membered rings and one or more substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group; a fused ring of one or more substituted or unsubstituted five-membered ring and one or more substituted or unsubstituted phenanthrenylene group; or a combination thereof.

The second electron donating moiety (D$^2$) may be, for example, one of the moieties listed in the above-mentioned Group 1, but is not limited thereto.

For example, the second electron donating moiety (D$^2$) may be the same as the first electron donating moiety (D$^1$).

For example, the second electron donating moiety (D$^2$) may be different from the first electron donating moiety (D$^1$).

For example, L$^3$ and L$^4$ may each independently be a divalent linking group including a single bond; at least one substituted or unsubstituted furan; at least one substituted or unsubstituted thiophene; at least one substituted or unsubstituted selenophene; at least one substituted or unsubstituted tellurophen; at least one substituted or unsubstituted pyrrole; at least one substituted or unsubstituted benzene; or a fused ring of the foregoing two or more; or a combination thereof. For example, L$^3$ and L$^4$ may be different from the second electron donating moiety (D$^2$), respectively.

For example, the linking group of the first structural unit and the linking group of the second structural unit may be the same or different, for example, L$^3$ may be the same as or different from L$^1$, and L$^4$ may be the same as or different from L$^2$.

For example, the polymer may include a first structural unit represented by Chemical Formula 3 and a second structural unit represented by Chemical Formula 6, and the first structural unit and the second structural unit may be alternately or randomly arranged.

[Chemical Formula 3]

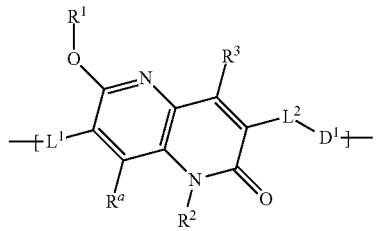

[Chemical Formula 6]

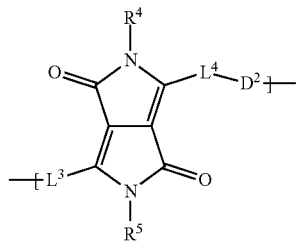

In Chemical Formula 3 or 6, L$^1$ to L$^4$, D$^1$, R$^1$ to R$^5$, and R$^a$ are as described above.

The number of first and second structural units in the polymer may be 1 to 1000.1 to 800.2 to 1000.2 to 800.5 to 800.5 to 700.5 to 500, or 5 to 300, respectively, but is not limited thereto. For example, the sum of the number of the first structural unit and the second structural unit in the polymer may not exceed 2000.

The first structural unit and the second structural unit may be included in, for example, a mole ratio of about 1:9 to about 9:1, and within the range of about 2:8 to about 8:2, about 3:7 to about 7:3, about 4:6 to about 6:4 or about 5:5.

For example, the first structural unit may be included in a mole ratio equal to or higher than the second structural unit, and they may be included in a mole ratio of, for example, about 5:5 to about 9:1, about 6:4 to about 9:1, or about 7:3 to about 9:1.

For example, the second structural unit may be included in a mole ratio equal to or higher than the first structural unit, and they may be included in a mole ratio of, for example, about 1:9 to about 5:5, about 2:8 to 5:5, or about 3:7 to 5:5.

The polymer may further include an additional structural unit different from the first structural unit and the second structural unit in addition to the first structural unit and the second structural unit described above.

The weight average molecular weight of the polymer may be about 5,000 Da to about 500,000 Da, and within the above range, it may be about 10,000 Da to about 300,000 Da, or about 30,000 Da to about 200,000 Da.

The aforementioned polymer may be implemented as a thin film. The thin film may be a stretchable polymer thin film. The stretchable polymer thin film may flexibly respond to external forces or external movements such as twisting, pressing and pulling due to the stretching characteristics of the polymer described above, and may be easily restored to its original state.

The elastic modulus of the stretchable polymer thin film may be, for example, less than about $10^7$ Pa, and within the above range, for example, may be greater than or equal to about 10 Pa and less than about $10^7$ Pa. For example, the elongation rate of the stretchable polymer thin film may be greater than or equal to about 10%, within the above range, about 10% to about 1000%, about 10% to about 800%, about 10% to about 500%, about 10% to about 300%, about 10% to about 200%, about 10% to about 100%, about 10% to about 90%, about 10% to about 80%, about 10% to about 70%, about 10% to about 60%, about 10% to about 50%, about 10% to about 40%, about 20% to about 70%, about 20% to about 60%, about 20% to about 50%, or about 20% to about 40%. Herein, the elongation rate may be a percentage of a length change that is increased to a breaking point with respect to the initial length. For example, when the stretchable polymer thin film is stretched, the change in the electrical characteristics of the stretchable polymer thin film may be relatively small. For example, when the stretchable polymer thin film is stretched by about 30%, the change in the charge mobility of the stretchable polymer thin film may be less than or equal to about 10%, less than or equal to about 8%, less than or equal to about 7%, less than or equal to about 5%, less than or equal to about 3%, or less than or equal to about 2%, or less than or equal to about 1%.

The stretchable polymer thin film may be a deposition thin film formed by vapor deposition or a coating thin film formed by a solution process. As described above, since the polymer has good solubility in an organic solvent, the stretchable polymer thin film may be a coating thin film formed by a solution process.

The stretchable polymer thin film may further include a binder and/or an elastomer in addition to the aforementioned polymer.

The binder may improve the dispersibility of the aforementioned polymer, and may be, for example, polystyrene, but is not limited thereto.

The elastomer may be blended with the aforementioned polymer to provide stretchability, and may include an organic elastomer, an organic/inorganic elastomer, an inorganic elastomer-like material, or a combination thereof. The organic elastomer or organic-inorganic elastomer may include a substituted or unsubstituted polyorganosiloxane such as polydimethylsiloxane; an elastomer including a substituted or unsubstituted butadiene moiety such as styrene-ethylene-butylene-styrene (SEBS), styrene-ethylene-propylene-styrene (SEPS), styrene-butadiene-styrene (SBS), styrene-isoprene-styrene (SIS), or styrene-isobutylene-styrene (SIBS); an elastomer including a urethane moiety, an elastomer including an acrylic moiety, an elastomer including an olefin moiety, or a combination thereof, but are not limited thereto. The inorganic elastomer-like material may include a ceramic having elasticity, a solid metal, a liquid metal, or a combination thereof, but is not limited thereto.

As described above, the stretchable polymer thin film may have high charge mobility while being stretchable by including a first structural unit providing stretchability and a second structural unit providing good electrical characteristics. Therefore, the stretchable polymer thin film may be applied to various electronic devices requiring stretchability and high charge mobility.

The electronic device may include, for example, an organic photoelectric device, an organic light emitting device, or an organic diode including an organic sensor; an organic thin film transistor; a wearable device such as a biometric sensor; or a device including them.

The electronic device may be applied to a bendable display panel, a foldable display panel, a rollable display panel, a wearable device, a skin-like display panel, a skin-like sensor, a large-area conformable display, smart clothing, and the like, but is not limited thereto.

Hereinafter, an example of a thin film transistor including the aforementioned polymer or stretchable polymer thin film is described with reference to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
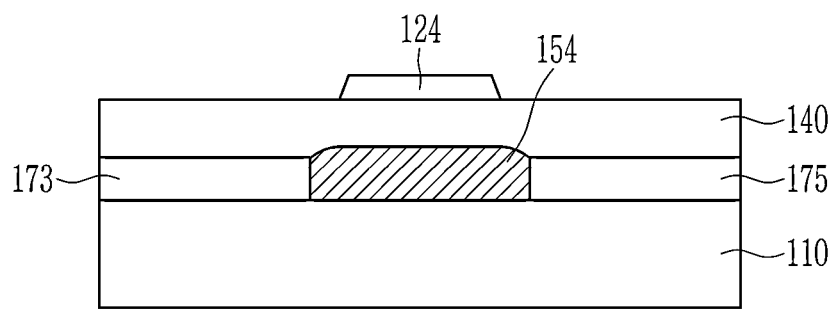
Figure 3:
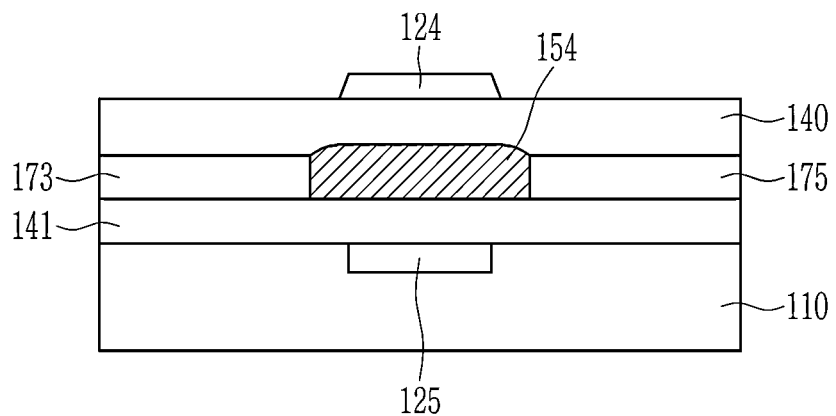

FIGS. 1 to 3 are cross-sectional views each showing a thin film transistor according to some example embodiments.

Referring to FIGS. 1 to 3, a thin film transistor according to some example embodiments includes a gate electrode 124, an organic semiconductor 154 overlapped with the gate electrode 124, a gate insulating layer 140 between the gate electrode 124 and the organic semiconductor 154, and a source electrode 173 and a drain electrode 175 electrically connected to the organic semiconductor 154.

First, referring to FIG. 1, a thin film transistor according to some example embodiments may be a thin film transistor having a bottom gate and top contact structure. Specifically, a thin film transistor according to some example embodiments includes a gate electrode 124 on the substrate 110; a gate insulating layer 140 on the gate electrode 124; an organic semiconductor 154 on the gate insulating layer 140; and a source electrode 173 and a drain electrode 175 electrically connected to the organic semiconductor 154.

The gate electrode 124 is disposed on a substrate 110 made of transparent glass, silicon, or polymer. The gate electrode 124 is connected to a gate line (not shown) transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

The gate insulating layer 140 is disposed on the gate electrode 124. The gate insulating layer 140 may be made of an organic material and/or an inorganic material. Examples of the organic material may include a soluble polymer compound such as a polyvinyl alcohol-based compound, a polyimide-based compound, a polyacryl-based compound, a polystyrene-based compound, benzocyclobutane (BCB), styrene-ethylene-butylene-styrene (SEBS), and the like, and examples of the inorganic material may include a silicon nitride ($SiN_x$) and silicon oxide ($SiO_2$).

The organic semiconductor 154 is disposed on the gate insulating layer 140. The organic semiconductor 154 may include the aforementioned polymer, and may be the aforementioned stretchable polymer thin film. The organic semiconductor 154 may be formed by a solution process such as spin coating, slit coating, or inkjet printing by preparing the aforementioned polymer in a solution form. The organic semiconductor 154 may be formed by vacuum evaporation or thermal evaporation of the aforementioned polymer.

The source electrode 173 and drain electrode 175 are disposed on the organic semiconductor 154. The source electrode 173 and the drain electrode 175 may face each other on the organic semiconductor 154. The source electrode 173 is connected to a data line (not shown) transmitting a data signal. The source electrode 173 and the drain electrode 175 may be made of at least one metal of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

Referring to FIG. 2, the thin film transistor according to some example embodiments may be a thin film transistor having a top gate and top contact structure, unlike the aforementioned example embodiment. Specifically, a thin film transistor according to some example embodiments includes an organic semiconductor 154 on the substrate 110; a source electrode 173 and a drain electrode 175 electrically connected to the organic semiconductor 154; a gate insulating layer 140 on the organic semiconductor 154, the source electrode 173, and the drain electrode 175; and a gate electrode 124 on the gate insulating layer 140.

Referring to FIG. 3, the thin film transistor according to some example embodiments may be a thin film transistor having a dual gate and bottom/top contact structure, unlike the aforementioned example embodiments. Specifically, a thin film transistor according to some example embodiments includes an organic semiconductor 154 on the substrate 110; a first gate electrode 125 positioned under the organic semiconductor 154; a second gate electrode 124 positioned on the organic semiconductor 154; a first gate insulating layer 141 between the organic semiconductor 154 and the first gate electrode 125; a second gate insulating layer 140 between the organic semiconductor 154 and the second gate electrode 124; and a source electrode 173 and a drain electrode 175 electrically connected to the organic semiconductor 154. The first gate electrode 125 may be buried in the substrate 110 or may be formed by impurity doping. The first gate electrode 125, the organic semiconductor 154, and the second gate electrode 124 may be overlapped with each other.

Herein, examples of the thin film transistor have been described, but embodiments of inventive concepts are not limited thereto and may be equally applied to thin film transistors having all structures.

The thin film transistor may be applied to various electronic devices as a switching device and/or a driving device. The electronic devices include, for example, a liquid crystal display device, an organic light emitting display device, a quantum dot display device, an electrophoretic display device, an organic photoelectric device, and an organic sensor, but is not limited thereto. The electronic device including the thin film transistor may be, for example, a flexible and stretchable electronic device, and may be a wearable device and/or a skin type device.

The aforementioned some example embodiments will be described in more detail through the following examples. However, the following examples are for illustrative purposes and do not limit the scope of the rights.

Simulation Evaluation

The twist angle according to the structure of the electron accepting moiety in the first structural unit of the polymer is evaluated.

The twist angle is used to predict the molecular structure in a stable state for Polymers A, B, and C based on density functional theory (DFT). In order to predict an energetically stable state of a molecular structure by using a Gaussian 09 program, Polymers A, B, and C in a form of an oligomer n=3 in which three repeating units are linked to each other are calculated by using a B3LYP method and a 6-31G basis set.

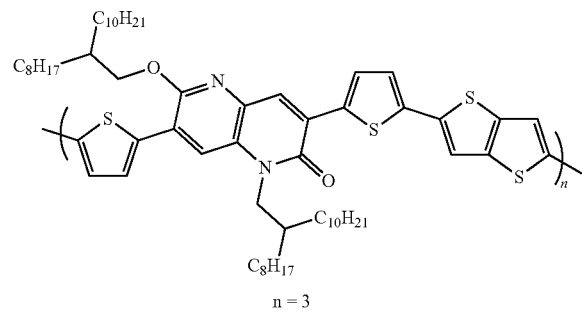

[Polymer A]

n = 3

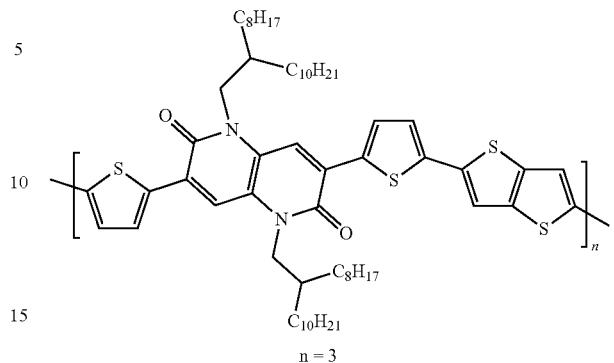

[Polymer B]

n = 3

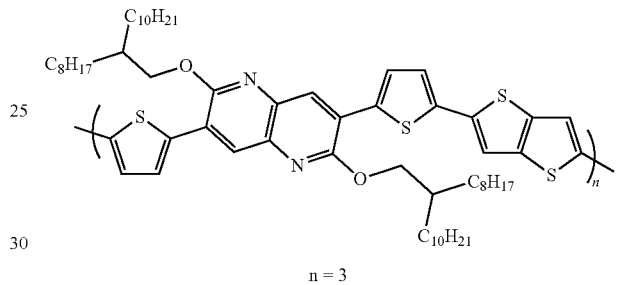

[Polymer C]

n = 3

Figure 4:
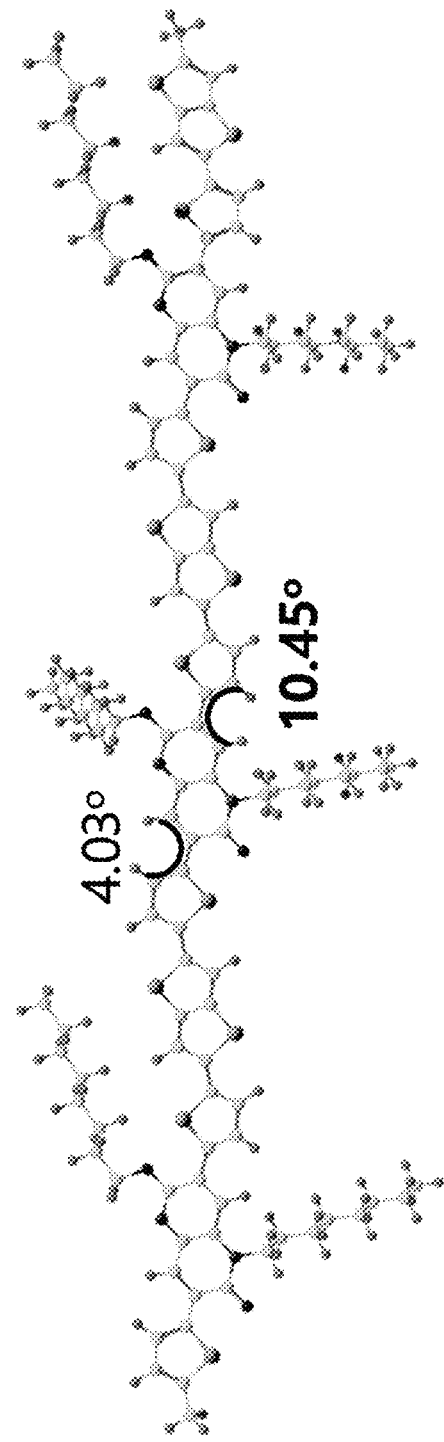
FIG. 4 is a simulation structure of Polymer A.
Figure 5:
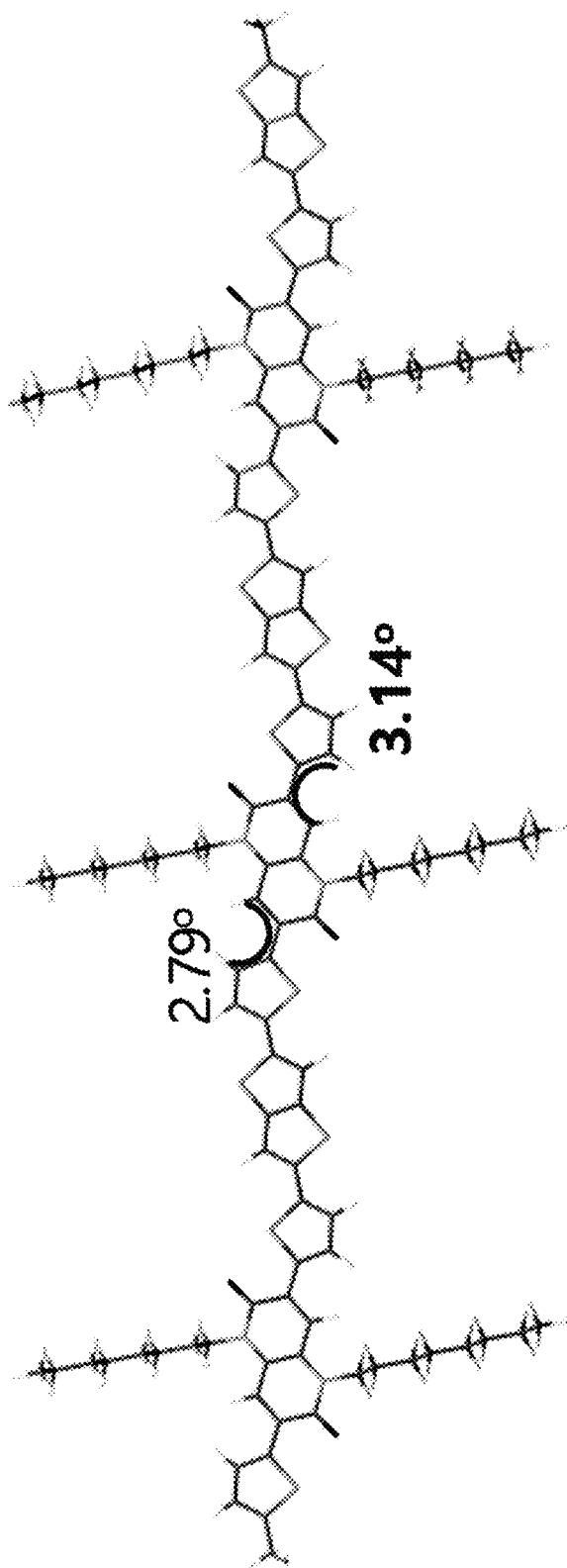
FIG. 5 is a simulation structure of Polymer B.
Figure 6:
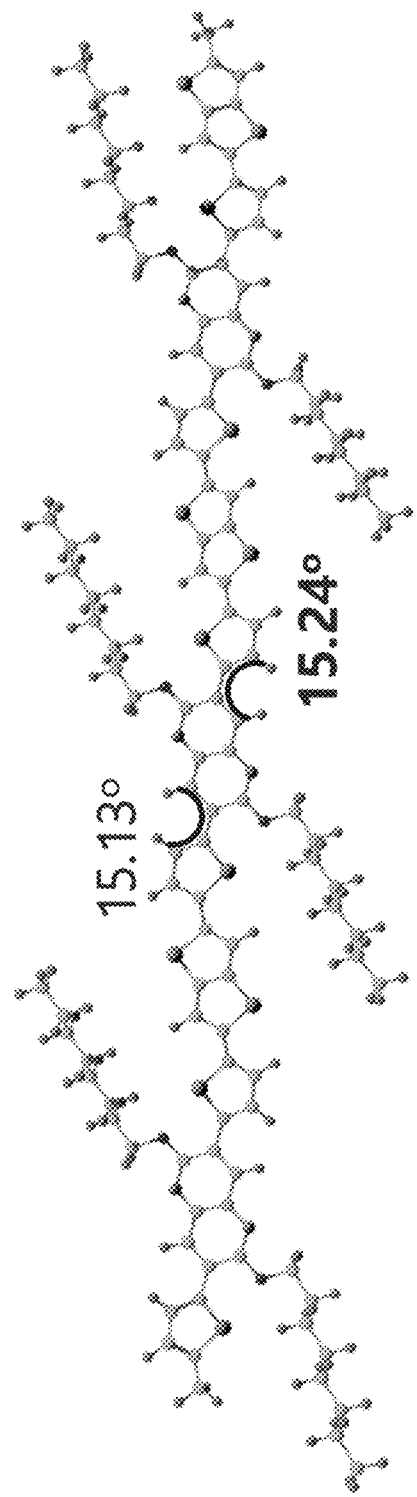
FIG. 6 is a simulation structure of Polymer C.

The results are shown in FIGS. 4 to 6 and Table 1.

FIG. 4 is a simulation structure of Polymer A, FIG. 5 is a simulation structure of Polymer B, and FIG. 6 is a simulation structure of Polymer C.

TABLE 1

|  | Twist angle 1 (degrees) | Twist angle 2 (degrees) |
|---|---|---|
| Polymer A | 4.03 | 10.45 |
| Polymer B | 2.79 | 3.14 |
| Polymer C | 15.13 | 15.24 |

Referring to FIGS. 4 to 6 and Table 1, Polymer A having an asymmetric functional group is asymmetrically twisted with an electron accepting moiety in the middle and exhibits more than two times different twist angles by each twist angle of 4.03° and 10.45° between the electron accepting moiety and its adjacent linking groups (thiophene), but Polymer B having a symmetric functional group exhibits not much different twist angles by each twist angle of 2.79° and 3.14° between the electron accepting moiety and its adjacent linking groups (thiophene), and Polymer C having a symmetric functional group exhibits not much different twist angles by each twist angle of 15.13° and 15.24° between the electron accepting moiety and its adjacent linking groups (thiophene). Accordingly, the polymer including electron accepting moiety having the asymmetric functional group is expected to apply a degree of freedom to a polymer main chain and thus work as a stretchable polymer.

Synthesis of Polymer

Synthesis Example 1

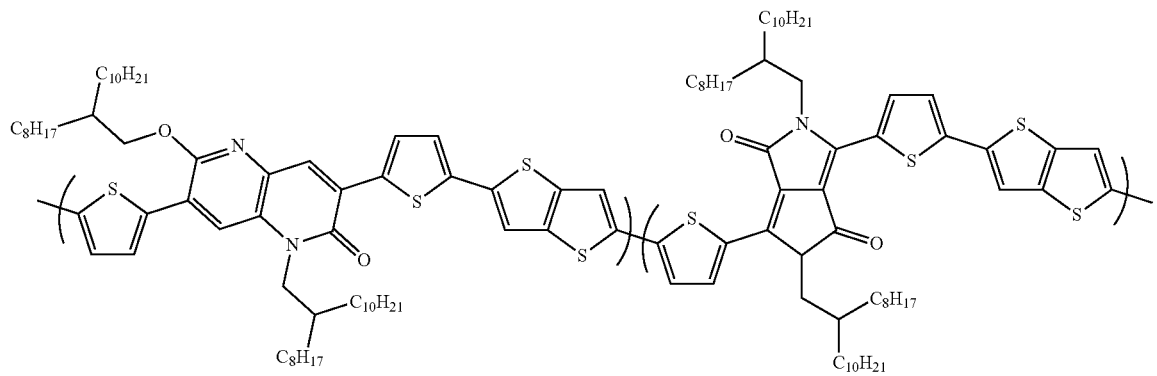

Step 1

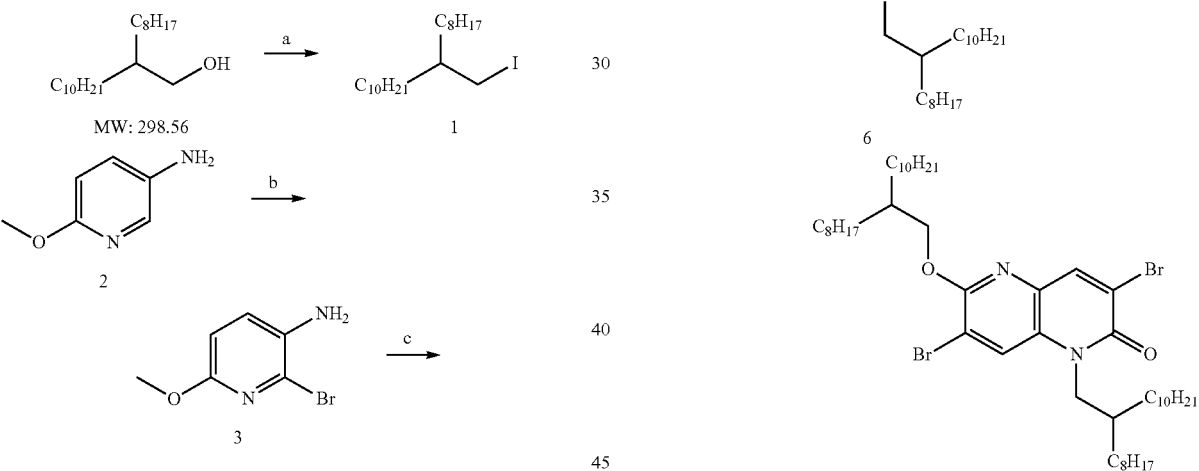

Condition: a) iodine (I$_2$), triphenylphosphine (PPh$_3$), imidazole, dichloromethane (DCM), b) bromine (Br$_2$), acetic acid (AcOH), sodium acetate (NaOAc), c) butyl acrylate, N,N-dicyclohexylmethylamine, palladium (II) acetate (Pd(OAC)$_2$), tri-t-butylphosphine (P(t-Bu)$_3$HBF$_4$), cumene, d) cesium carbonate (Cs$_2$CO$_3$), DMSO, e) 48% HBr, f) cesium carbonate (Cs$_2$CO$_3$), DMSO, toluene → bromine (Br$_2$), chloroform (CHCl$_3$)

(1) Synthesis of Intermediate 1

After purging Ar gas in a three-necked round-bottomed flask to create an inert atmosphere, a dichloromethane (DCM) solvent and triphenylphosphine (PPh$_3$, 1.3 eqv.) are put therein. After sufficiently stirred at room temperature, imidazole (1.3 eqv.) is added thereto and then, stirred until it is completely dissolved and then, cooled down to 0° C. Subsequently, while maintained at 0° C., iodine (I$_2$, 1.3 eqv.) is slowly added thereto in a dropwise fashion, and after confirming a color of the reactant is changed, 2-octyldodecan-1-ol (1 eqv.) is dissolved in dichloromethane and then, slowly added in a dropwise fashion thereto and then, stirred for 1 hour, while maintained at 0° C. Then, the resultant is slowly heated up to room temperature and additionally stirred for 1 hour, completing a reaction. Column chromatography is performed for purification to obtain Intermediate 1.

(2) Synthesis of Intermediate 3

Intermediate 3 is obtained by mixing bromine (Br$_2$) with a mixture of 6-methoxypyridine-3-amine (Material 2), acetic acid (AcOH), and sodium acetate (NaOAc) and then, reacting them.

(3) Synthesis of Intermediate 4

Intermediate 4 is obtained according to the method described in Chem.Pharm.Bull., 33 (1985), p. 4764. Specifically, Intermediate 3 and butyl acrylate are dissolved in a cumene solvent, and palladium(II) acetate (Pd(OAC)$_2$) as catalysts and tri-t-butylphosphine (P(t-Bu)$_3$HBF$_4$) and N,N-dicyclohexylmethylamine are added thereto, and then, a Heck coupling reaction is performed to obtain Intermediate 4.

(4) Synthesis of Intermediate 5

Material 4 (1 eqv.), 1-bromo-2-octyldodecane (1.8 eqv.), and cesium carbonate (1 eqv.) are dissolved in a dimethyl sulfoxide (DMSO) solvent and then, stirred at 6° C. for 24 hours. Subsequently, after decreasing the temperature to room temperature and removing the solvent, the residue therefrom is purified through column chromatography to obtain brown yellow powder. The yield is 38%.

(5) Synthesis of Intermediate 6

Intermediate 5 is dissolved in an HBr aqueous solution at a concentration of 48% and then, stirred at 80° C. for 4 hours. Subsequently, after decreasing the temperature to room temperature, a resultant therefrom is filtered to remove the solvent, and precipitates therefrom are more than 3 times washed with water and vacuum-dried to obtain yellow powder. The yield is 96%.

(6) Synthesis of Intermediate 7

Intermediate 6 (1 eqv.), 1-bromo-2-octyldodecane (3 eqv.), and cesium carbonate (1.5 eqv.) are dissolved in toluene and then, stirred at 120° C. for 24 hours. Subsequently, after decreasing the temperature to room temperature and removing the solvent, the residue therefrom is purified through column chromatography to obtain yellow brown powder. The yield is 42%. The resultant therefrom is dried, and N-bromosuccinimide (2.5 eqv.) is dissolved in acetic acid and then, stirred at 90° C. for 24 hours. Subsequently, after decreasing the temperature to room temperature and removing the solvent, the residue therefrom is purified through column chromatography to obtain Intermediate 7. The yield is 65%.

The structure and purity of Intermediate 7 are analyzed through NMR and LC-MS. Purity thereof is 99% or higher.

$^1$H NMR (CDCl$_3$, 300 MHz): δ[ppm]: 8.19 (s, 1H, Ar—H), 7.86 (s, 1H, Ar—H), 4.28 (2H, Aryl H), 4.21(2H, Aryl H), 1.91(1H, Aryl H), 1.83(1H, Aryl H), 1.38-1.24 (m, 64H, Aryl H), 0.89 (m, 12H, Aryl H); LC-MS (m/z (%)) calcd: 881.02; Found: 881.68

Step 2

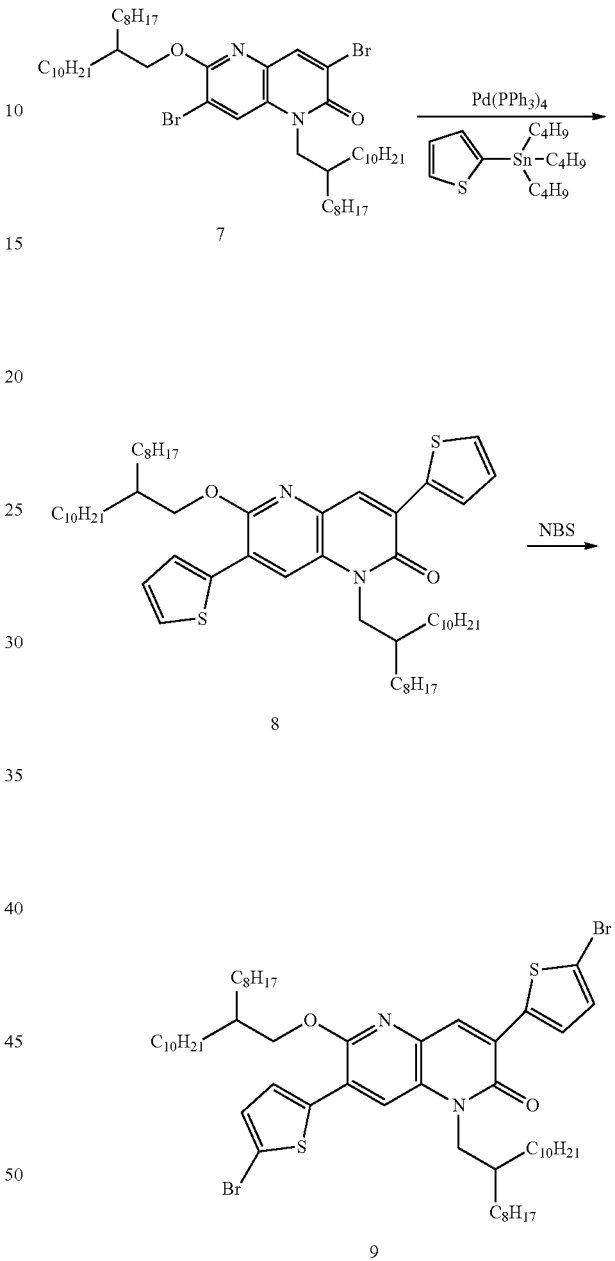

A catalyst of tetrakis(triphenylphosphine)palladium (0) (Pd(PPh$_3$)$_4$, 0.04 mmol) is used to react Intermediate 7 (0.78 mmol) and tributyl(thiophen-2-yl)stannane (2.32 mmol) in 14 ml of a DMF solvent at 130° C. for 12 hours, synthesizing Intermediate 8. Intermediate 8 is also analyzed with respect to purity through LC-MS, and purity thereof is 99% or higher.

Intermediate 9 is synthesized by reacting Intermediate 8 (0.43 mmol) with N-bromosuccinimide (NBS, 0.87 mmol) in chloroform.

LC-MS (m/z (%)) calcd: 1045.26; Found: 1045.66

Step 3

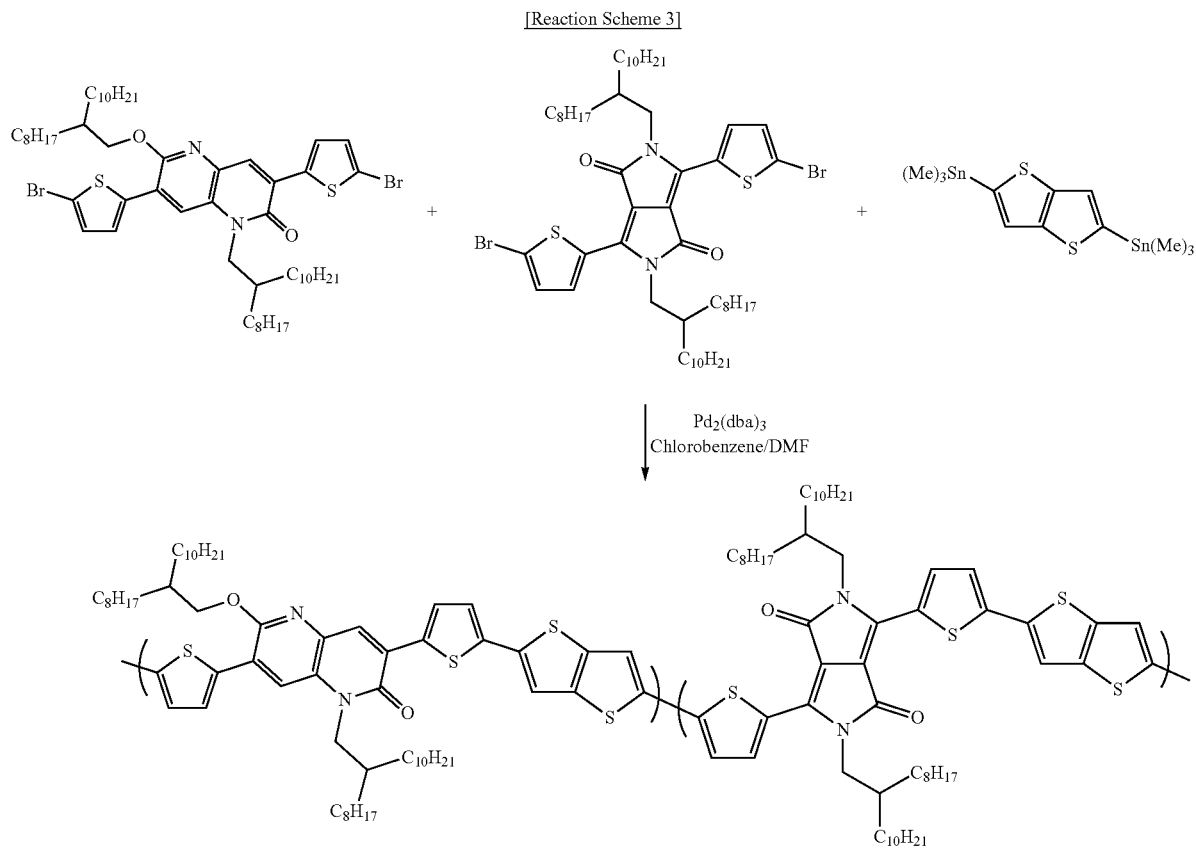

In a flask, 3,7-bis(5-bromothiophen-2-yl)-1-(2-octyldodecyl)-6-((2-octyldodecyl)oxy)-1,5-naphthyridin-2(1H)-one (Intermediate 9, 0.505 mmole), 3,6-bis(5-bromothiophen-2-yl)-2,5-bis(2-octyldodecyl)-2,5-dihydropyrrolo[3,4-c]pyrrole-1,4-dione (0.505 mmole), and 2,5-bis(trimethylstannyl)thieno[3,2-b]thiophene (1.0 mmole) are dissolved in 30 ml of chlorobenzene under a nitrogen atmosphere and then, heated at about 130° C. Subsequently, 2 mol % of tris(dibenzylideneacetone)dipalladium (0) ($Pd_2(dba)_3$) is added to the reaction mixture. After a reaction for 12 hours, 1 mL of 2-tributylstannylthiophene is added thereto and then, stirred for 12 hours, completing the reaction, and the resultant is cooled down to room temperature. Subsequently, the resultant is diluted in chloroform and washed sequentially with a 1 N HCl solution, water (3 times), a 10% ammonia aqueous solution, and water (3 times), and a chloroform solution layer therefrom is dried and concentrated under a reduced pressure to recover a high molecular weight material. The obtained product is extracted with methanol, acetone, dichloromethane, and chloroform through Soxhlet, and among them, an extract in the chloroform is concentrated, obtaining a polymer. The yield is 70%, and the polymer has a number average molecular weight of 55,000.

$^1$H NMR (CDCl$_3$, 300 MHz): δ[ppm]: 7.47 (m, Ar—H), 7.06 (m, Ar—H), 6.94 (m, Ar—H), 5.35 (m, Ar—H), 3.65 (s, Aryl H), 1.26-1.43 (m, Aryl H), 0.84-0.89 (m, Aryl H)

Reference Synthesis Example 1

Step 1

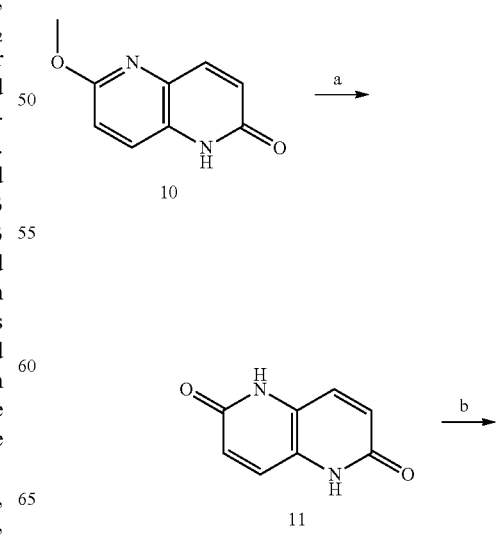

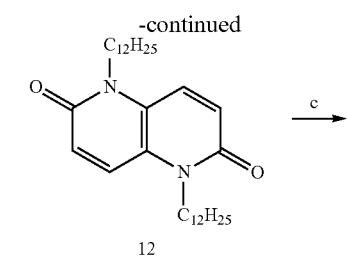

12

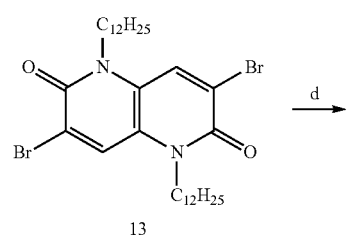

13

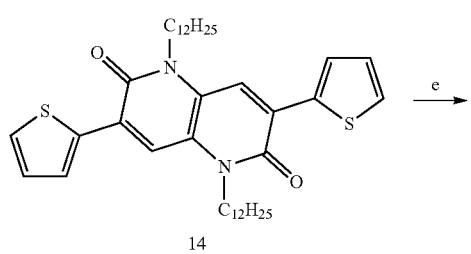

14

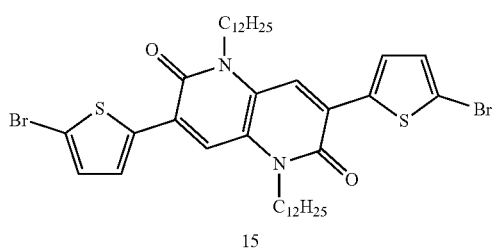

15

(1) Synthesis of Intermediate 11

Intermediate 10 (the same as Intermediate 4) and 6-methoxy-1,5-naphthyridin-2(1H)-one are dissolved in an HBr aqueous solution at a concentration of 48% and then, stirred at 80° C. for 4 hours. Subsequently, after decreasing the temperature to room temperature, a resultant therefrom is filtered to remove the solvent, and precipitates therefrom are more than 3 times washed with water and vacuum-dried to obtain yellow powder of Intermediate 11. The yield is 94%.

(2) Synthesis of Intermediate 12

Intermediate 11 (1 eqv.), 1-bromo-dodecane (3 eqv.), and cesium carbonate (2 eqv.) are dissolved in toluene and then, stirred at 120° C. for 24 hours. Subsequently, after decreasing the temperature to room temperature and removing the solvent, the residue therefrom is purified through column chromatography, obtaining yellow brown powder of Intermediate 12. The yield is 32%.

(3) Synthesis of Intermediate 13

Intermediate 12 and N-bromosuccinimide (2.5 eqv.) are dissolved in acetic acid and then, stirred at 90° C. for 24 hours. Subsequently, after decreasing the temperature to room temperature and removing the solvent, the residue therefrom is purified through column chromatography to obtain Intermediate 13. The yield is 62%.

(4) Synthesis of Intermediates 14 and 15

Intermediates 14 and 15 are obtained in the same manner as in Step 2 of Synthesis Example 1.

Step 2

[Reaction Scheme 5]

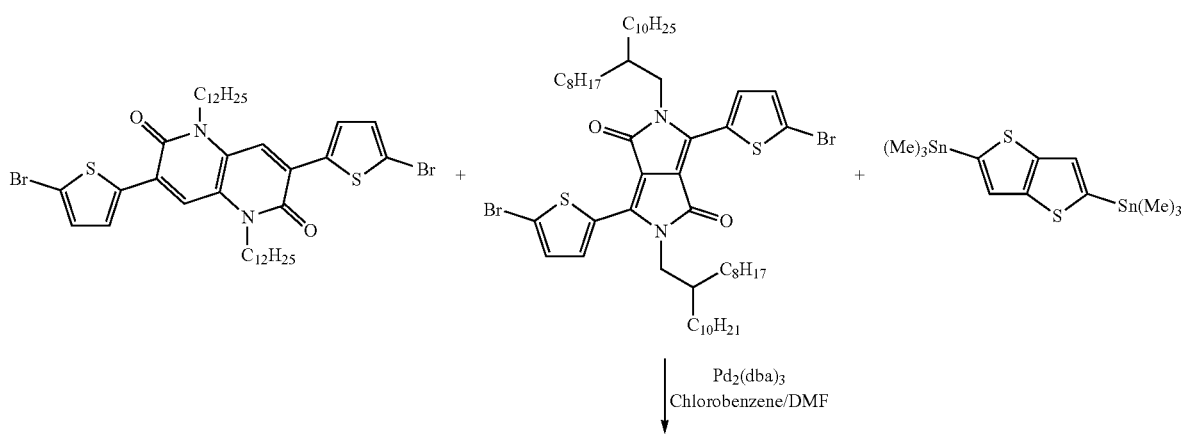

-continued

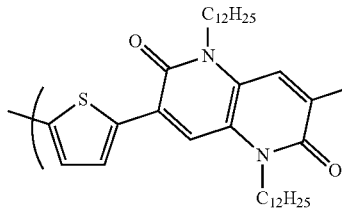
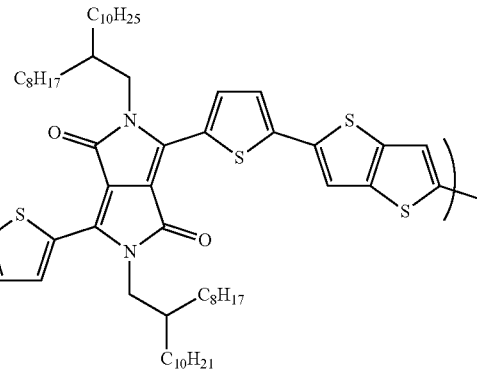

A polymer is obtained in the same manner as in Step 3 of Synthesis Example 1, except that Intermediate 15 is used instead of Intermediate 9.

$^1$H NMR (CDCl$_3$, 300 MHz): δ[ppm]: 7.72 (m, Ar—H), 7.55 (m, Ar—H), 7.47 (m, Ar—H), 4.31(s, Aryl H), 4.15(s, Aryl H), 4.09(s, Aryl H), 3.65 (s, Aryl H), 1.26-1.43 (m, Aryl H), 0.85-0.89 (m, Aryl H)

Manufacture of Stretchable Polymer Thin Film

Example 1

A polymer solution prepared by blending the polymer of Synthesis Example 1 in chlorobenzene at a concentration of 0.6 wt % is spin-coated on a styrene-ethylene-butylene-styrene (SEBS) substrate with a thickness of 1000 Å at 1000 rpm, and heat-treated it at 130° C. under a nitrogen atmosphere for 1 hour to form a stretchable polymer thin film.

Evaluation I

The stretchable polymer thin film according to Example 1 is 50% and 100% stretched in a direction (e.g., x direction) to examine whether or not cracks occur.

Figure 7:
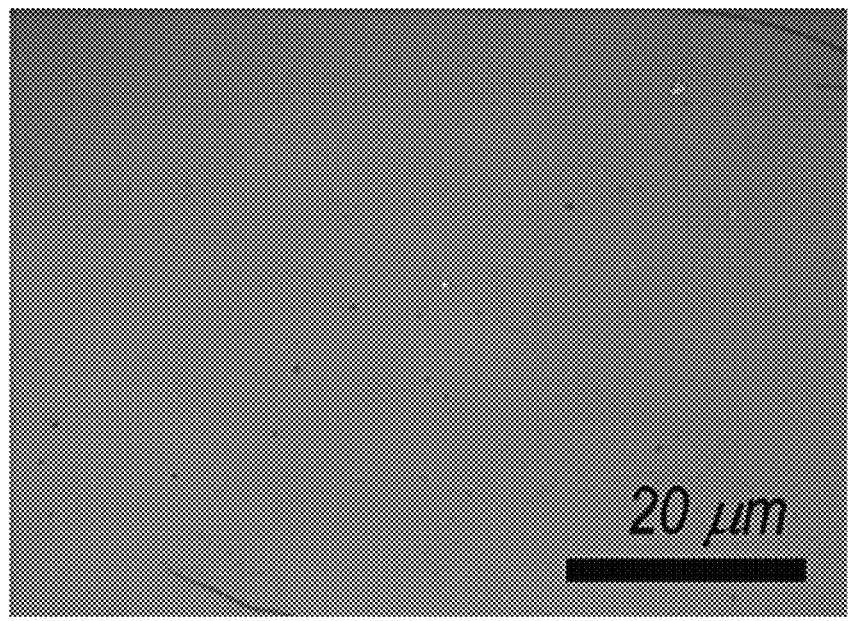
FIG. 7 is a photograph of the stretchable polymer thin film according to Example 1 before stretching.
Figure 8:
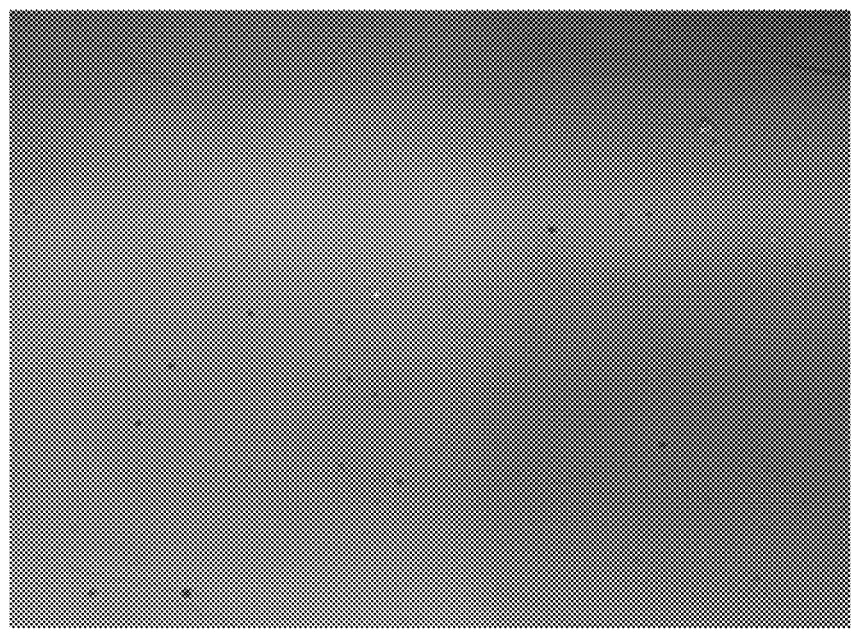
FIG. 8 is a photograph when the stretchable polymer thin film according to Example 1 is stretched by 50%.
Figure 9:
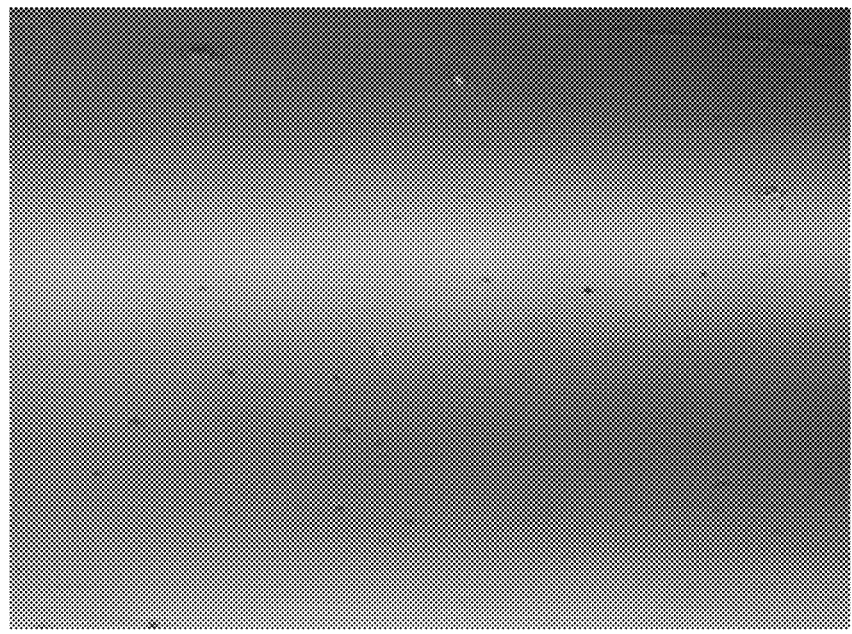
FIG. 9 is a photograph when the stretchable polymer thin film according to Example 1 is stretched 100%.

FIG. 7 is a photograph of the stretchable polymer thin film according to Example 1 before stretching, FIG. 8 is a photograph when the stretchable polymer thin film according to Example 1 is stretched by 50%, and FIG. 9 is a photograph when the stretchable polymer thin film according to Example 1 is stretched 100%.

Referring to FIGS. 7 to 9, the stretchable polymer thin film according to Example 1 is not substantially cracked.

Manufacture of Thin Film Transistor

Example 2

Au is thermally deposited on a styrene-ethylene-butylene-styrene (SEBS) substrate to form a gate electrode. Subsequently, an SEBS solution is coated thereon and annealed at 100° C. for 0.5 hour to form a gate insulating layer. Subsequently, the polymer of Synthesis Example 1 and SEBS in a weight ratio of 4:6 are blended in chlorobenzene at a concentration of 0.6 wt % to prepare an organic semiconductor solution, and the organic semiconductor solution is spin-coated to be 1000 Å thick at 1000 rpm on the gate insulating layer and heat-treated under a nitrogen atmosphere at 130° C. for 1 hour, forming an organic semiconductor. Then, Au is thermally deposited on the organic semiconductor to form a source electrode and a drain electrode, manufacturing a stretchable thin film transistor.

Reference Example

A stretchable thin film transistor is manufactured according to the same method as Example 2 except that the polymer according to Reference Synthesis Example 1 is used instead of the polymer according to Synthesis Example 1.

Evaluation II

The surface morphology of the organic semiconductor in the stretchable thin film transistors according to Example and Reference Examples is checked.

The surface morphology is confirmed by atomic force microscopy (AFM).

Figure 10:
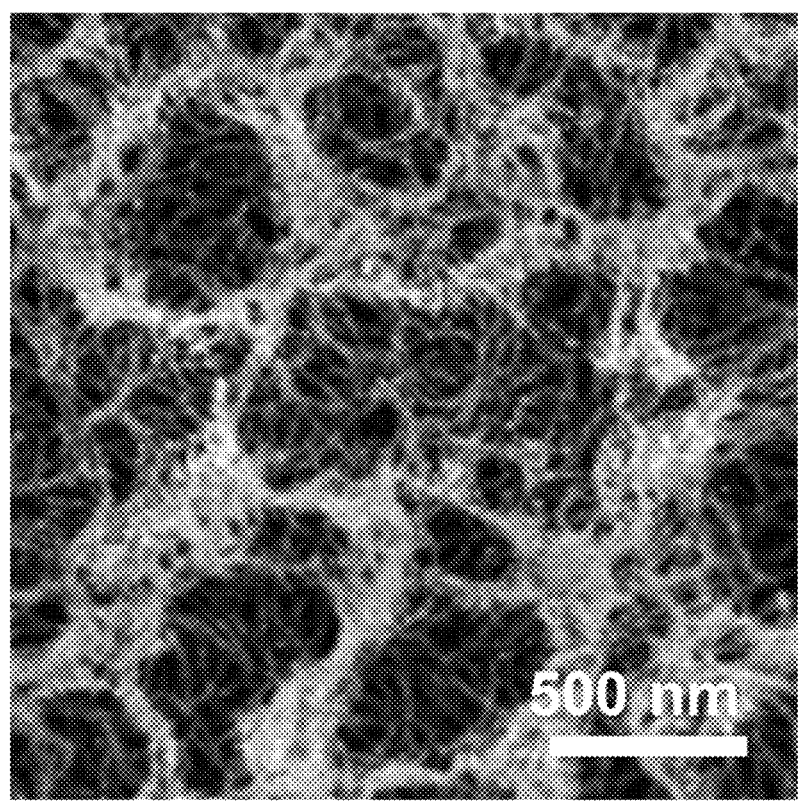
FIG. 10 is an AFM photograph of an organic semiconductor in the stretchable thin film transistor according to Example 2.
Figure 11:
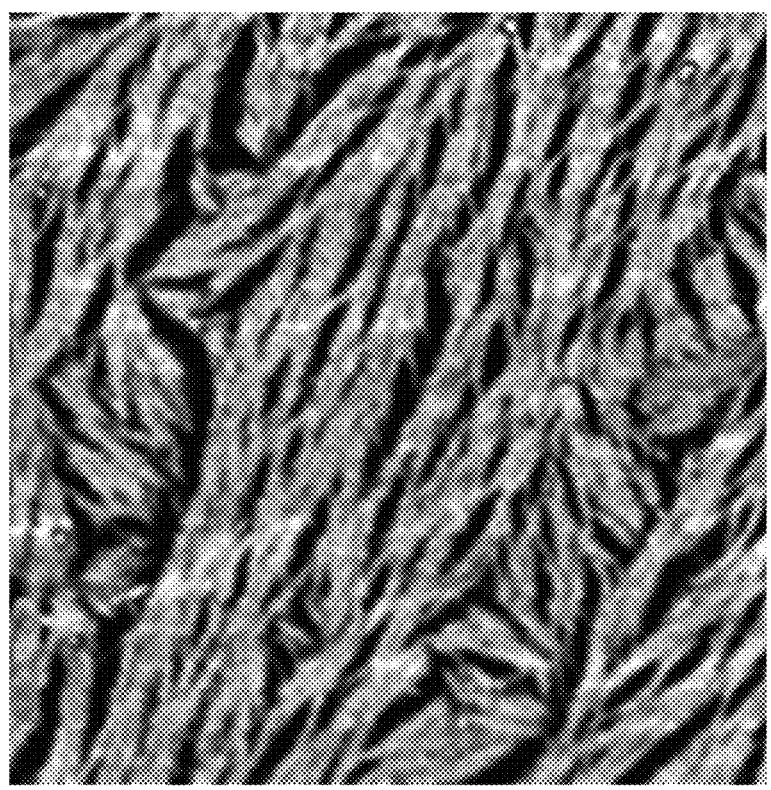
FIG. 11 is an AFM photograph of an organic semiconductor in a stretchable thin film transistor according to the Reference Example.

The results are shown in FIGS. 10 and 11.

FIG. 10 is an AFM photograph of an organic semiconductor in the stretchable thin film transistor according to Example 2, and FIG. 11 is an AFM photograph of an organic semiconductor in a stretchable thin film transistor according to Reference Example.

Referring to FIGS. 10 and 11, the organic semiconductor of the stretchable thin film transistor according to Example 2 has a similar network structure formed of several to tens of nanometer-thick chains to that of the organic semiconductor of the stretchable thin film transistor according to the Reference Example but a lower density than that of the organic semiconductor of the stretchable thin film transistor according to the reference example. Accordingly, the organic semiconductor of the stretchable thin film transistor according to Example 2 may have higher spatial degrees of freedom during the stretching and thus may be expected to exhibit excellent stretching characteristics, compared with the organic semiconductor of the stretchable thin film transistor according to Reference Example.

Evaluation III

The stretchable thin film transistors according to Example and Reference Example are evaluated with respect to electrical characteristics, when a gate voltage (−20 V to 10 V) and a drain voltage (−20 V) are applied thereto.

Electrical signals according to the stretching are evaluated from a current value ($I_{DS}$) flowing between the source electrode and the drain electrode, when a voltage in a range of 10 V to −20 V is applied between the gate electrode and the source electrode under a condition of applying a voltage of 20 V to the source electrode and the drain electrode.

Figure 12:
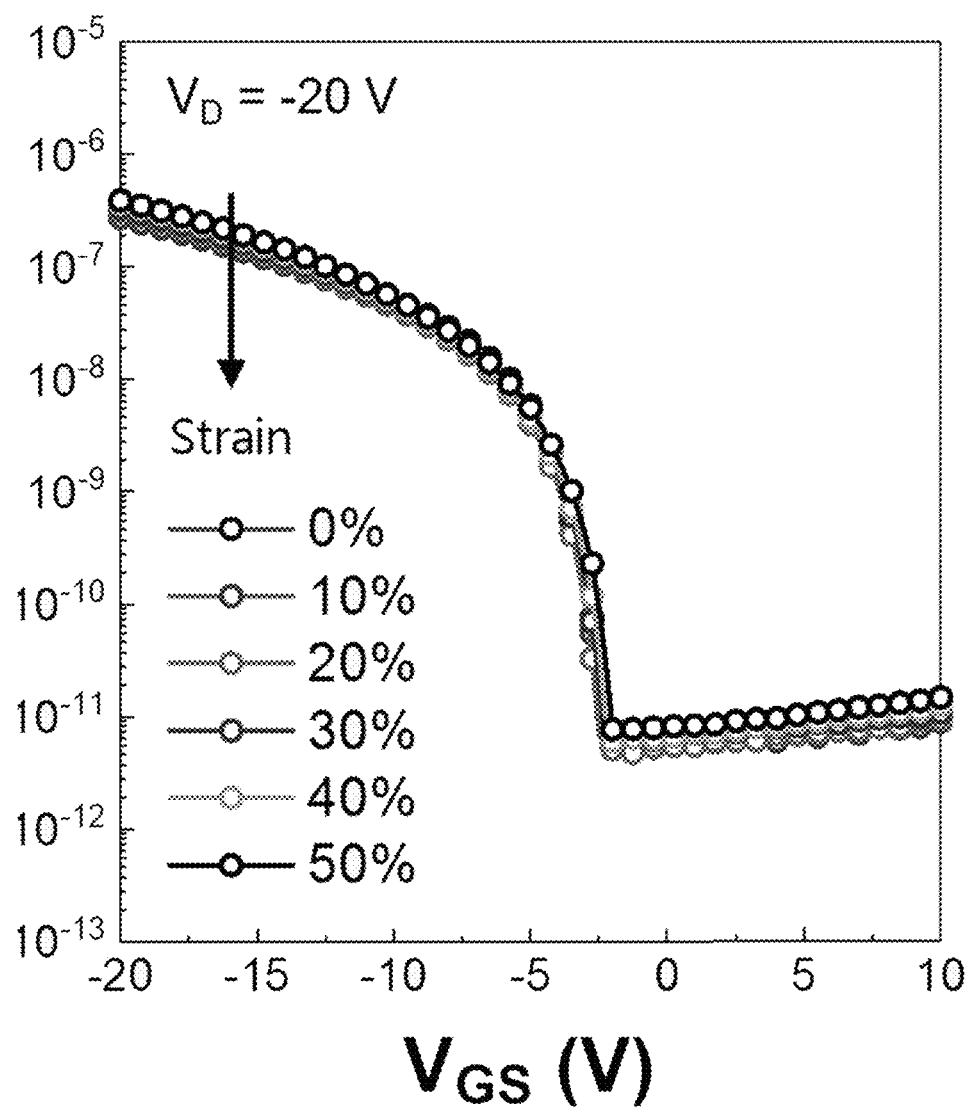
FIG. 12 is a graph showing electrical characteristics according to strain when the stretchable thin film transistor according to Example 2 is stretched in a vertical direction with respect to a channel length direction.
Figure 13:
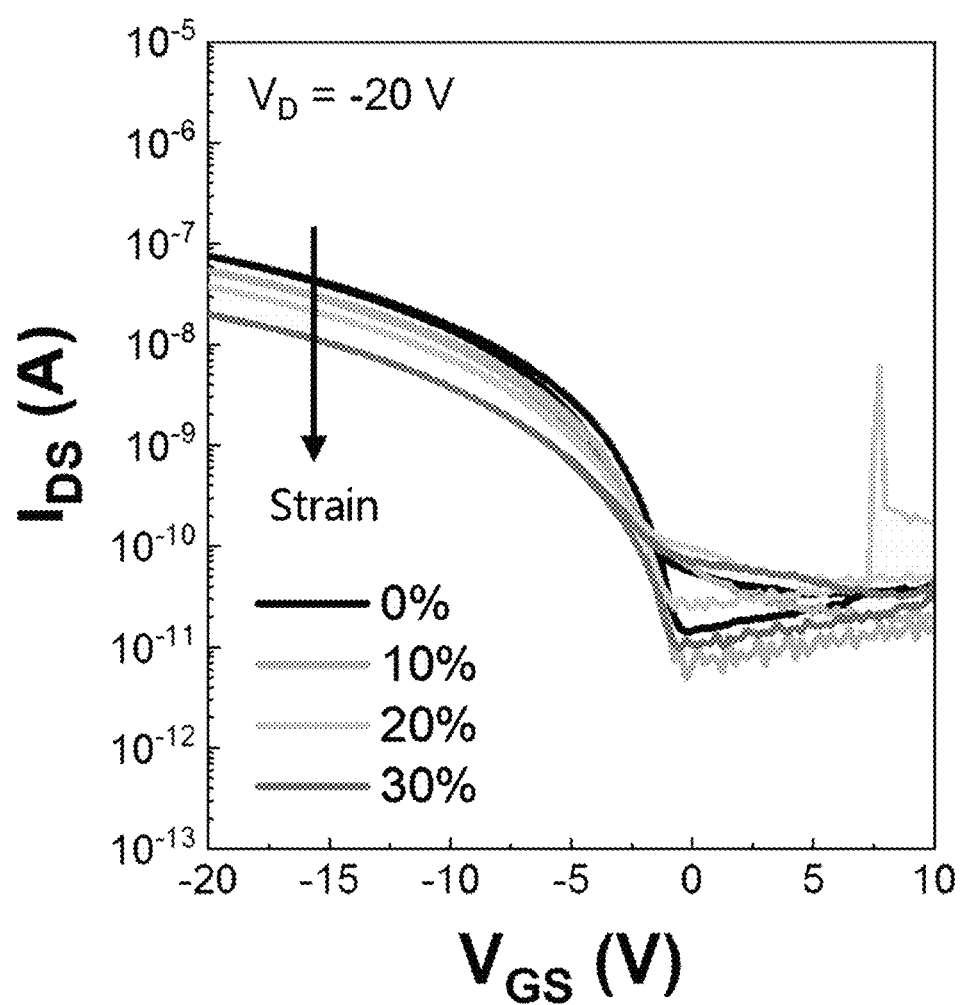
FIG. 13 is a graph showing electrical characteristics according to strain when a stretchable thin film transistor according to the Reference Example is stretched in a vertical direction with respect to a channel length direction.

The results are shown in FIGS. 12 and 13 and Table 2.

FIG. 12 is a graph showing electrical characteristics according to strain when the stretchable thin film transistor according to Example 2 is stretched in a vertical direction with respect to a channel length direction, and FIG. 13 is a graph showing electrical characteristics according to strain when a stretchable thin film transistor according to a reference example is stretched in a vertical direction with respect to a channel length direction.

TABLE 2

|  | Charge mobility ($cm^2$/Vs) (@ 0% strain) | Charge mobility retention rate (%) (@ 30% strain) |
| --- | --- | --- |
| Example 2 | 0.5 | >95% |
| Reference Example | 0.1 | 10% |

Referring to FIGS. 12 and 13 and Table 2, the stretchable thin film transistor according to Example exhibits almost no current value change at a strain of 0% to 50%, but the stretchable thin film transistor according to Reference Example exhibits a larger current change, as the strain becomes higher. Accordingly, the stretchable thin film transistor according to Example has higher electrical stability when stretching, compared with the stretchable thin film transistor according to Reference Example.

While this disclosure has been described in connection with what is presently considered to be practical example embodiments, it is to be understood that inventive concepts not limited to the disclosed embodiments, but, on the contrary, are intended to cover various modifications and equivalent arrangements included within the spirit and scope of the appended claims.

What is claimed is:

1. A polymer, comprising a first structural unit including a first electron accepting moiety and a first electron donating moiety, and a second structural unit including a second electron accepting moiety and a second electron donating moiety, the second electron accepting moiety being different from the first electron accepting moiety, and the second electron donating moiety being the same as or different from the first electron donating moiety, wherein the first structural unit is represented by Chemical Formula 1,

[Chemical Formula 1]

wherein, in Chemical Formula 1, $D^1$ is the first electron donating moiety, $L^1$ and $L^2$ are each independently a single bond, a substituted or unsubstituted C6 to C30 arylene group, a substituted or unsubstituted divalent C3 to C30 heterocyclic group, a fused ring thereof, or a combination thereof, $A^1$ is the first electron accepting moiety and is represented by Chemical Formula 2,

[Chemical Formula 2]

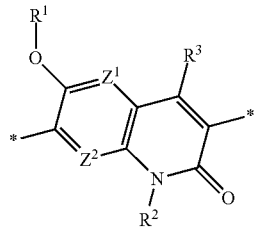

wherein, in Chemical Formula 2, $Z^1$ and $Z^2$ are each independently N or $CR^a$, at least one of $Z^1$ and $Z^2$ is N, $R^1$ is a substituted or unsubstituted C1 to C30 alkyl group, a substituted or unsubstituted C2 to C30 alkoxyalkyl group, a substituted or unsubstituted C6 to C30 aryl group, —$COR^b$, —$COOR^c$, a halogen, a cyano group, or a combination thereof, $R^2$, $R^3$, and $R^a$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or a combination thereof, $R^b$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and

* is a linking point with Chemical Formula 1, wherein the first structural unit and the second structural unit are included in a mole ratio of about 1:9 to about 9:1.

2. The polymer of claim 1, wherein $D^1$ is a substituted or unsubstituted C6 to C30 arylene group; a substituted or unsubstituted divalent C3 to C30 heterocyclic group including at least one of N, O, S, Se, Te, and Si; a fused ring thereof; or a combination thereof.

3. The polymer of claim 2, wherein $D^1$ is one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered ring including at least one of N, O, S, Se, Te, and Si; a fused ring of two or more of the substituted or unsubstituted five-membered rings; a fused ring of one or more substituted or unsubstituted five-membered rings and one or more substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group; a fused ring of one or more substituted or unsubstituted five-membered ring and one or more substituted or unsubstituted phenanthrenylene group; or a combination thereof.

4. The polymer of claim 1, wherein $L^1$ and $L^2$ are each independently a substituted or unsubstituted C6 to C30 arylene group; a substituted or unsubstituted divalent C3 to C30 heterocyclic group including at least one of N, O, S, Se, Te, and Si; a fused ring thereof; or a combination thereof, and each of $L^1$ and $L^2$ is different from $D^1$.

5. The polymer of claim 1, wherein the first structural unit is represented by Chemical Formula 3:

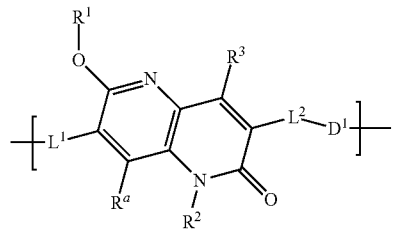

[Chemical Formula 3]

wherein, in Chemical Formula 3,
- $D^1$ is a substituted or unsubstituted C6 to C30 arylene group; a substituted or unsubstituted divalent C3 to C30 heterocyclic group including at least one of N, O, S, Se, Te, and Si; a fused ring thereof; or a combination thereof,
- $L^1$ and $L^2$ are each independently a single bond, a substituted or unsubstituted C6 to C30 arylene group, a substituted or unsubstituted divalent C3 to C30 heterocyclic group, a fused ring thereof, or a combination thereof,
- $R^1$ is a substituted or unsubstituted C1 to C30 alkyl group, a substituted or unsubstituted C2 to C30 alkoxyalkyl group, a substituted or unsubstituted C6 to C30 aryl group, $-COR^b$, $-COOR^c$, a halogen, a cyano group, or a combination thereof,
- $R^2$, $R^3$, and $R^a$ are each independently hydrogen, a substituted or unsubstituted C1 to C30 alkyl group, a substituted or unsubstituted C1 to C30 alkoxy group, a substituted or unsubstituted $C_2$ to C30 alkoxyalkyl group, a substituted or unsubstituted C6 to C30 aryl group, $-COR^d$, $-OCOR^e$, $-COOR^f$, $-OCOOR^g$, a halogen, a cyano group, or a combination thereof, and
- $R^b$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group or a combination thereof.

6. The polymer of claim 5, wherein $R^1$ and $R^2$ are each independently a substituted or unsubstituted C6 to C30 linear alkyl group or a substituted or unsubstituted C6 to C30 branched alkyl group.

7. The polymer of claim 1, wherein the second structural unit is represented by Chemical Formula 4:

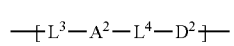

[Chemical Formula 4]

wherein, in Chemical Formula 4,
- $D^2$ is the second electron donating moiety, and
- $L^3$ and $L^4$ are each independently a single bond, a substituted or unsubstituted C6 to C30 arylene group, a substituted or unsubstituted divalent C3 to C30 heterocyclic group, a fused ring thereof, or a combination thereof,
- $A^2$ is the second electron accepting moiety and is represented by Chemical Formula 5,

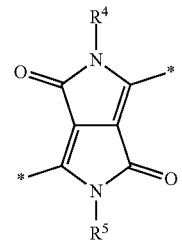

[Chemical Formula 5]

wherein, in Chemical Formula 5,
- $R^4$ and $R^5$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, $-COR^d$, $-OCOR^e$, $-COOR^f$, $-OCOOR^g$, a halogen, a cyano group, or a combination thereof,
- $R^d$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and
- \* is a linking point with Chemical Formula 4.

8. The polymer of claim 7, wherein $D^2$ is a substituted or unsubstituted C6 to C30 arylene group; a substituted or unsubstituted divalent C3 to C30 heterocyclic group including at least one of N, O, S, Se, Te, and Si; a fused ring thereof; or a combination thereof.

9. The polymer of claim 8, wherein
$D^2$ is one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered rings including at least one of N, O, S, Se, Te, and Si; a fused ring of two or more of the substituted or unsubstituted five-membered rings; a fused ring of at least one of the substituted or unsubstituted five-membered rings and at least one substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group a fused ring of one or more substituted or unsubstituted five-membered ring and one or more substituted or unsubstituted phenanthrenylene group; or a combination thereof.

10. The polymer of claim 7, wherein
$L^3$ and $L^4$ are each independently a substituted or unsubstituted C6 to C30 arylene group; a substituted or unsubstituted divalent C3 to C30 heterocyclic group including at least one of N, O, S, Se, and Te; a fused ring thereof; or a combination thereof, and
each of $L^3$ and $L^4$ is different from $D^2$.

11. The polymer of claim 1, wherein
the first structural unit is represented by Chemical Formula 3,
the second structural unit is represented by Chemical Formula 6:

[Chemical Formula 3]

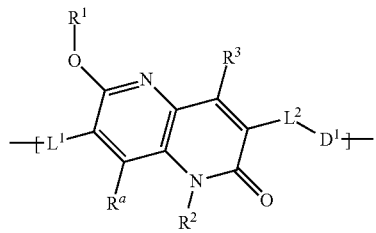

[Chemical Formula 6]

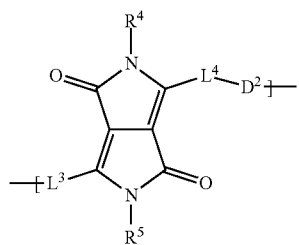

wherein, in Chemical Formula 3 or 6, $L^1$ to $L^4$ are each independently a substituted or unsubstituted C6 to C30 arylene group; a substituted or unsubstituted divalent C3 to C30 heterocyclic group including at least one of N, O, S, Se, and Te; a fused ring thereof; or a combination thereof, $R^1$ is a substituted or unsubstituted C1 to C30 alkyl group, a substituted or unsubstituted C2 to C30 alkoxyalkyl group, a substituted or unsubstituted C6 to C30 aryl group, —$COR^b$, —$COOR^c$, a halogen, a cyano group, or a combination thereof, $R^2$ to $R^5$ and $R^a$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —$COR^d$, —$OCOR^e$, —$COOR^f$, —$OCOOR^g$, a halogen, a cyano group, or a combination thereof, $R^b$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or a combination thereof, and $D^1$ and $D^2$ are each independently one or more substituted or unsubstituted phenylene group; one or more substituted or unsubstituted naphthylene group; one or more substituted or unsubstituted anthracenylene group; one or more substituted or unsubstituted phenanthrenylene group; one or more substituted or unsubstituted five-membered rings including at least one of N, O, S, Se, Te, and Si; a fused ring of two or more of the substituted or unsubstituted five-membered rings; a fused ring of at least one of the substituted or unsubstituted five-membered rings and at least one substituted or unsubstituted phenylene group; a fused ring of one or more substituted or unsubstituted five-membered ring and one or more substituted or unsubstituted naphthylene group; a fused ring of one or more substituted or unsubstituted five-membered ring and one or more substituted or unsubstituted anthracenylene group a fused ring of one or more substituted or unsubstituted five-membered ring and one or more substituted or unsubstituted phenanthrenylene group; or a combination thereof.

12. The polymer of claim 11, wherein the second electron donating moiety is the same as the first electron donating moiety.

13. The polymer of claim 1, wherein a difference between a twist angle between $A^1$ and $L^1$ and a twist angle between $A^1$ and $L^2$ of the first structural unit is about twice or more.

14. The polymer of claim 1, wherein the first structural unit is a structural unit providing stretchability.

15. A stretchable polymer thin film comprising:
the polymer of claim 1.

16. The stretchable polymer thin film of claim 15, further comprising:
an elastomer.

17. The stretchable polymer thin film of claim 15, wherein the stretchable polymer thin film has a change in charge mobility of less than or equal to about 10% when stretched by about 30%.

18. An electronic device comprising:
the stretchable polymer thin film of claim 15.

19. The electronic device of claim 18, wherein the electronic device comprises an organic diode, an organic thin film transistor or a wearable device.

* * * * *